United States Patent
Eaddy et al.

[11] Patent Number: 5,559,445
[45] Date of Patent: Sep. 24, 1996

[54] ADAPTER FOR TESTING INTEGRATED CIRCUITS

[75] Inventors: Jasper Eaddy; William M. Pistole, III, both of Ft. Lauderdale; Robert J. Gentile, Plantation, all of Fla.

[73] Assignee: Motorola, Inc., Schaumburg, Ill.

[21] Appl. No.: 333,663

[22] Filed: Nov. 3, 1994

[51] Int. Cl.$^6$ .................................. G01R 1/06
[52] U.S. Cl. .......................... 324/755; 324/158.1
[58] Field of Search ...................... 324/765, 755, 324/72.5, 754; 439/525, 526, 66, 55, 68–73, 75, 86; 361/784, 785, 794

[56] References Cited

U.S. PATENT DOCUMENTS

| | | | |
|---|---|---|---|
| 4,862,076 | 8/1989 | Renner et al. | 324/755 |
| 5,176,525 | 1/1993 | Nierescher et al. | 324/755 |
| 5,177,436 | 1/1993 | Lee | 324/754 |
| 5,363,038 | 11/1994 | Love | 324/158.1 |
| 5,399,982 | 3/1995 | Duller et al. | 324/755 |

*Primary Examiner*—Vinh P. Nguyen
*Attorney, Agent, or Firm*—Frank M. Scutch, III

[57] ABSTRACT

A IC test adapter (100) for adapting the pin configuration of a chip carrier for use with test equipment. The IC test adapter (100) includes a case (101), printed circuit board (131), electrical contact pad (141), pin grid array (151) and bracket (161).

6 Claims, 2 Drawing Sheets

ADAPTER FOR TESTING INTEGRATED CIRCUITS

TECHNICAL FIELD

This invention relates in general to integrated circuits and more particularly to integrated circuit testing.

BACKGROUND

Commonly used chip carriers such as controlled collapsible chip carrier connections (C5) and the like are today used in many IC package designs. Specifically, the term C5 is only one variety of carrier and refers to the contacting scheme which uses solder spheres or balls on a component that has been reflowed onto the contact side of a surface mount package. This type of configuration is used to interface the IC, located within the chip carrier, with the outside environment.

Previously, many techniques have been used to test C5 packages as well as others. These techniques all require some interface between the chip carrier with a specific test apparatus. Often, in order to accommodate particular test equipment, it may be necessary to actually modify the chip carrier in order to provide and acceptable interface. Obviously, this can turn into a cumbersome task requiring a number of electrical modifications consuming much time and effort. Moreover, in view of the large number of chips which may need to be tested, this task becomes impractical leading often to IC packages which become untested to due the time factors involved. Since many chips are tested prior to shipment or during repair the delay in setting up an interface between IC and test equipment directly translates into a great increase in time. This ultimately increases chip cost and consumer expense of the product.

Therefore, it is evident the need exists for a device which can be used to easily test a variety of chip carriers including C5 chip packages. The device should be inexpensive to manufacture, easy to use and have a high reliability to accurately test IC packages to check for proper and correct operational parameters.

DETAILED DESCRIPTION OF THE PREFERRED EMBODIMENT

Figure 1:
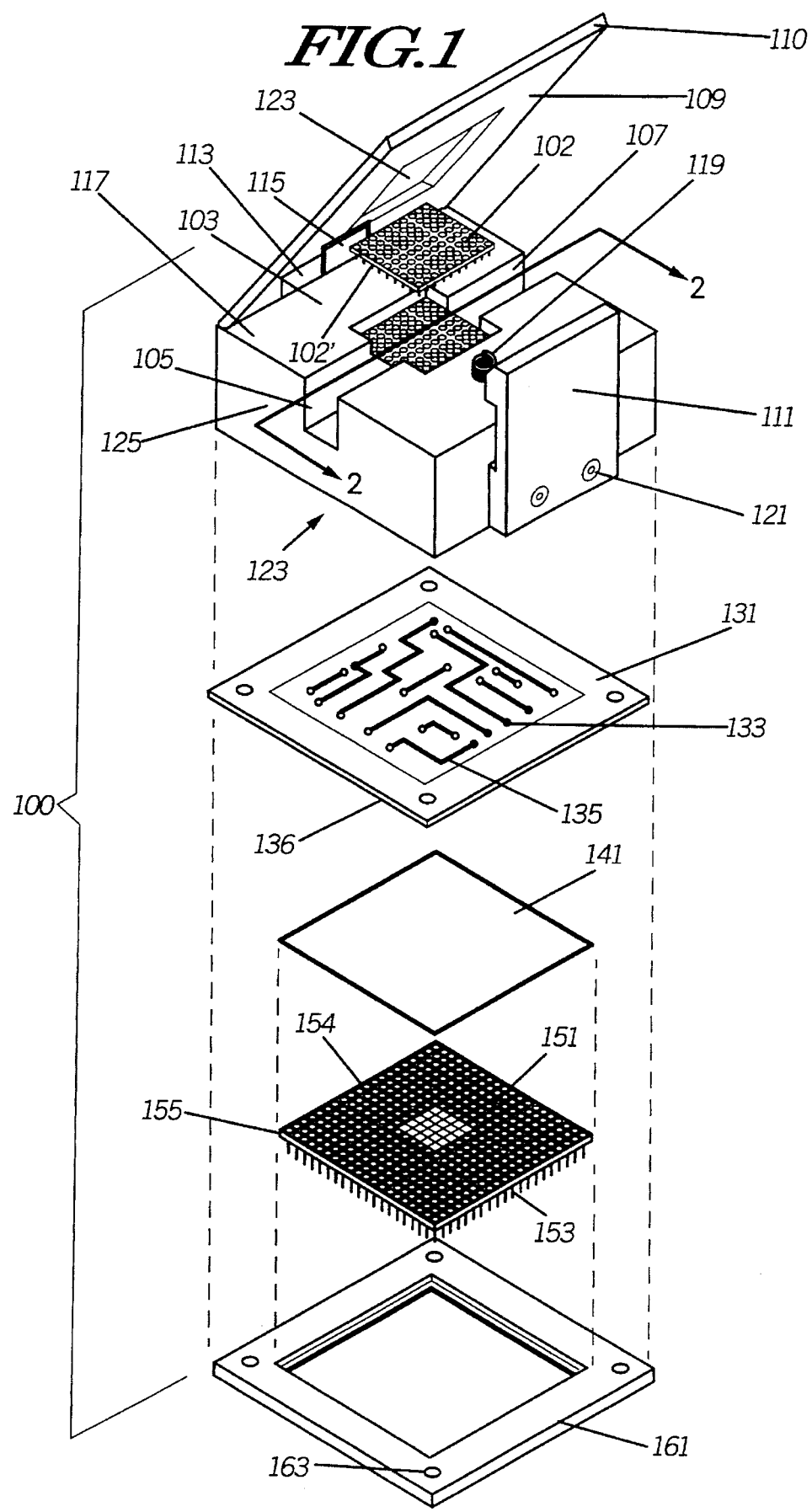
FIG. 1 is an exploded isometric view of a preferred embodiment of the present invention.

Referring now to FIG. 1, an IC test adapter according to a preferred embodiment of the invention is shown generally at 100. IC test adapter 100 includes a case 101 which is substantially square in shape and includes a main chip carrier indent 103 and side carrier indents 105, 107. Although shown in a square configuration, it will be evident to those skilled in the art that any shape is possible which may accommodate a chip carrier 102. When used in operation, a chip carrier 102 such as a C5 carrier or the like is positioned within main chip carrier indent 103 so as pins 102' protruding from either side of chip carrier 102 are aligned with side carrier indents 105, 107. A cover 109 is used with latch 111 to secure cover 109 over the upper portion of chip carrier 102. This allows chip carrier 102 and pins 102' to be firmly held in position while under test.

Cover 109 includes a joint 113 which fits within hinge 115 and is fixedly attached to a top side 117 of case 101. Cover 109 also includes a beveled edge 110 which allows cover 109 to rest flush with the side of case 101 when closed. A latch 111 is fastened to case 101 using screws 121 and is biased against spring 119 when cover 109 is set in a downward locked position. Cover 109 also includes a window 123 which allows the upper portion of chip carrier 102 to be viewed while the cover 109 is down and locked into position.

Positioned within case 101, a plurality of variable length pins 125 are fixedly attached within case 101 through a plurality of apertures (not shown) so as the ends of the variable length pins 125 face upwardly towards the cover 109 and case bottom 123 respectively. Variable length pins 125 are formed using two sections which are biased to return to variable length pins 125 to their full length or extended position. Variable length pins 125 function as electrical contacts or probes to connect chip carrier 102 to a circuit board 131. When chip carrier 102 is placed under cover 109 and cover 109 is fastened using 111, the entire case 101 is capable of moving i.e. adjusting downward in relation to circuit board 131 in view of the adjustability of variable Length pins 125.

Circuit board 131 is a double sided printed circuit board which includes a plurality of apertures 133 which correspond to the shape of pattern configuration made of variable length pins 125 when positioned within case 101. A plurality of runners 135 are routed on the top and bottom sides of circuit board 131 and act to electrically connect variable length pins 125 with a plurality of solder bumps or solder balls (not shown) which are arranged in a predetermined pattern, on the lower surface 136 of circuit board 131. As is well known in the art, solder balls or bumps generally are reflowed solder parts which are semi-spherical in shape providing a protruding bump to make electrical contact. The predetermined pattern of the solder balls are arranged at the lower surface 136 of circuit board 131 to accommodate a pattern of pins or contact probes 153 used with pin grid array 151.

Located below printed circuit board 131, a conductive contact pad such as electrical contact pad 141 is used. Contact pad 141 may be a unitary piece of conductive elastomeric material or the like. Electrical contact pad 141 is used to insure a proper electrical connection and adequate electrical continuity between the solder balls 137 and pin grid array 151. The electrical contact pad 141 is solid and is embedded with a high conductive material such as copper or the like as in cut into a predetermined shape and size to accommodate the surface area between the circuit board 131 and pin grid array 151.

Pin grid array 151 acts as an interface means between a test device (not shown) and the solder balls located at the lower surface 136 and circuit board 131. Pin grid array utilizes a plurality of contact probes 153 which are fixedly attached within substrate 155. Contact probes 153 are used to attached to appropriate test equipment (not shown) and are each a fixed length. Contact probes 153 include a flat side 154 for connection to their respective solder balls on the printed circuit board 131. Pin grid array 151 is secured to case 101 and printed circuit board 131 using a bracket 161. Bracket 161 and printed circuit board 131 each include a plurality of holes 163 which are aligned and are used with fastening screws (not shown) to secure case 101, printed circuit board 131, electrical contact pad 141 and pin grid array 151 into an one complete assembly.

Figure 2:
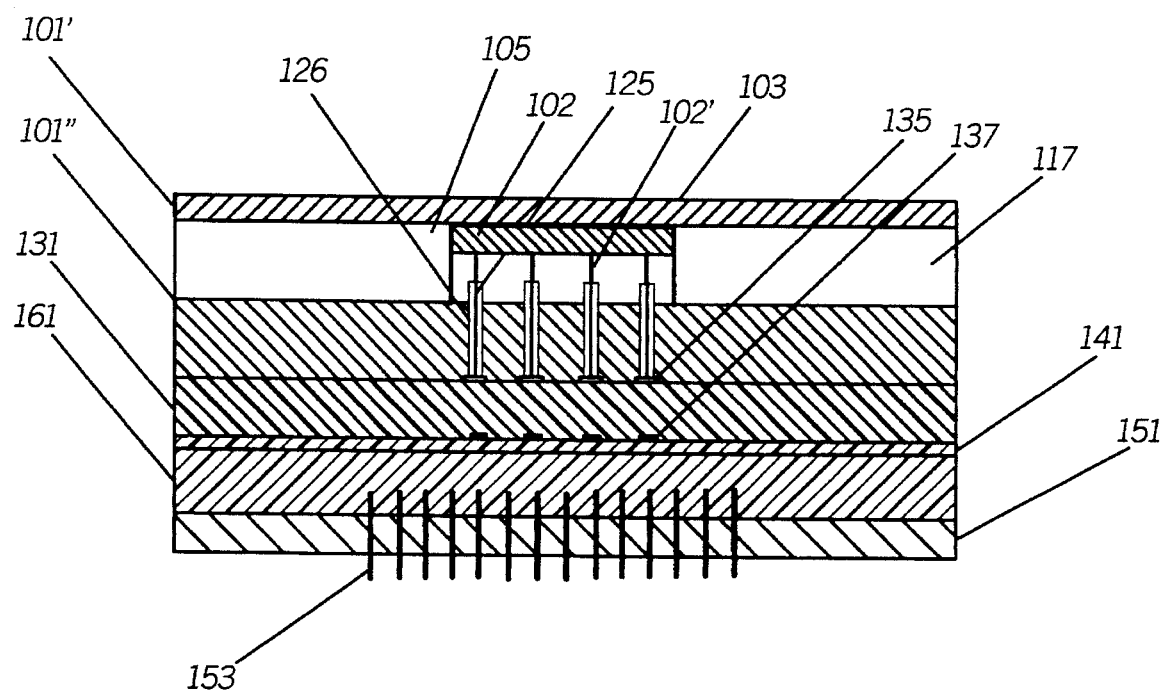
FIG. 2 is a cross-sectional view taken from section lines 2—2 shown in FIG. 1.

FIG. 2 represents a cross-sectional view taken along section lines 2—2 shown in FIG. 1. FIG. 2 shows the IC test adapter 100 in an assembled condition. Upper case portion 101' is shown above main chip carrier indent 103 and side carrier indents 105, 107. Variable length pins 125 are fixedly positioned within an aperture or shaft 126 located within the lower case portion 101". Each of variable length pins 125 extend to the upper surface of printed circuit board 131. At the upper surface of printed circuit board 131, variable length pins 125 make electrical contact with a plurality of conductors or runners (not shown). At the lower surface of printed circuit board 131, solder bumps or solder balls 137 electrically connect with electrical contact pad 141. Electrical contact pad 141 ensures electrical contact between solder balls 137 and contact probes 153 located with pin grid array 151. Finally a bracket 161 extends around the pin grid array 151 to hold or sandwich each of the sections together using screws or other attachment means (not shown) in each of the bracket 161 corners to secure the entire IC test adapter 100.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An adapter used to adapt an integrated circuit chip carrier to a testing apparatus for testing integrated circuits comprising:

socket means for accepting a chip carrier, said socket means including a plurality of longitudinally adjustable probes extending within the socket means for contacting connecting pins extending from said chip carrier;

circuit board means for connecting said plurality of adjustable probes to a plurality of solder balls arranged on said circuit board means in a predetermined pattern; and a pin array means for holding a plurality of test pins in a predetermined configuration, said plurality of test pins providing electrical contact between said plurality of solder balls and said testing apparatus.

2. An adapter as in claim 1 wherein said circuit board means is a double sided printed circuit board including first and second sides, said first side further including a plurality of conductors for connecting said plurality of adjustable probes to said plurality of solder balls which are arranged on said second side of said circuit board.

3. An adapter as in claim 1 wherein said pin array means is comprised of a substrate with a plurality of apertures for holding said plurality of test pins.

4. An integrated circuit testing adapter for adapting a chip carrier to test equipment comprising:

a housing for accepting at least one chip carrier, said housing including a hinged cover for holding said chip carrier in a fixed position within said housing;

a plurality of adjustable length contact pins extending through an interior portion of said housing for providing electrical contact with said chip carrier;

a circuit board including first and second sides positioned under said housing and contacting said plurality of adjustable length contact pins on said first side, said circuit board providing a connection between said plurality of adjustable contact pins and a plurality of solder balls on said second side of said circuit board, wherein said plurality of solder balls are arranged in a predetermined pattern;

a pin array forming a grid and positioned under said circuit board, said pin array connected to said plurality of solder balls for providing electrical contact between said plurality of solder balls and said test equipment;

at least one layer of conductive elastomeric material positioned between said circuit board and pin array for providing increased electrical contact between said plurality of solder balls and pin array; and whereby said plurality of adjustable length contact pins adjust longitudinally in response to said chip carrier being placed in said housing so said housing moves in relation to said circuit board to maintain electrical contact with said chip carrier.

5. An integrated circuit testing adapter as in claim 4 wherein said first side of said circuit board includes a plurality of runners which connect said plurality of adjustable length pins to said plurality of solder balls.

6. An integrated circuit testing adapter as in claim 4 wherein said pin array is physically attached to said circuit board with a bracket.

* * * * *